United States Patent [19]

Lu

[11] Patent Number: 5,110,752
[45] Date of Patent: May 5, 1992

[54] ROUGHENED POLYSILICON SURFACE CAPACITOR ELECTRODE PLATE FOR HIGH DENSITY DRAM

[75] Inventor: Chih-Yuan Lu, Taipei, Taiwan

[73] Assignee: Industrial Technology Research Institute, Hsinchu, Taiwan

[21] Appl. No.: 727,873

[22] Filed: Jul. 10, 1991

[51] Int. Cl.$^5$ ............................................. H01L 21/70
[52] U.S. Cl. .......................................... 437/47; 437/48; 437/52; 29/25.03
[58] Field of Search ........................... 437/47, 48, 52; 29/25.03; 357/23.6

[56] References Cited

U.S. PATENT DOCUMENTS

| | | | |
|---|---|---|---|
| 5,043,780 | 8/1991 | Fazan et al. | 357/23.6 |
| 5,049,517 | 9/1991 | Liu et al. | 437/48 |

FOREIGN PATENT DOCUMENTS

| | | | |
|---|---|---|---|
| 0203557 | 8/1990 | Japan | 357/23.6 |
| 0265267 | 10/1990 | Japan | 437/52 |

OTHER PUBLICATIONS

Fazan et al., "Electrical characterization of textured interpoly capacitors for advanced stacked DRAMS", IEDM 1990 Tech. Digest, pp. 663–666.
M. Sakao et al., "A Capacitor-over-bit-line (COB) cell with a Hemispherical-grain . . .", IEDM 1990 Tech. Digest, pp. 655–658.
Yoshimara et al., "Rugged surface poly-Si electrode . . .", IEDM 1990 Technical Digest, pp. 663–666.

Primary Examiner—Olik Chaudhuri
Assistant Examiner—Ourmaid S. Ojan
Attorney, Agent, or Firm—George O. Saile

[57] ABSTRACT

A method of fabricating a microminaturized capacitor having an electrode that is roughened to increase the effective area per unit area and resulting structure, particularly adapted for use in high density dynamic random access memory devices. The method involves depositing a conductive polycrystalline silicon layer. The depositing a metal such as a refractory metal over the polysilicon layer. The composite layer is heated to form a metal silicide and roughened polycrystalline silicon surface while the grains also grow large. The metal silicide is removed, leaving a roughened surface. The capacitor dielectric layer is deposited upon the roughened surface. The second conductive polycrystalline silicon layer is now formed upon said dielectric layer to complete the capacitor.

17 Claims, 2 Drawing Sheets

ROUGHENED POLYSILICON SURFACE CAPACITOR ELECTRODE PLATE FOR HIGH DENSITY DRAM

BACKGROUND OF THE INVENTION

1. Field of the Invention

This invention relates to the fabrication of integrated circuit devices and more particularly to a method of fabricating high density dynamic random access memory (DRAM) devices and the like.

2. Description of the Prior Art

As DRAMs are scaled down in dimensions, there is a continuous challenge to maintain a sufficiently high stored charge per capacitor unit area. In order to construct high density DRAMs in a reasonable sized chip area, the cell structures have to change from the conventional planar-type capacitors to either trench capacitors or stack capacitors, in particular beyond the 4 Mbit DRAM era. All efforts to increase capacitance without increasing the planar area of the capacitor can be categorized into the following techniques:

(1) Thinning the capacitor dielectric and/or using films with a higher dielectric constant, such as oxide-nitride-oxide (ONO) films composite, and more recently tantalum pertoxide which will require further development to overcome leakage and reliability problems.

(2) Building three dimensional capacitor structures to increase the capacitor area without increasing the planar area of the capacitor. There are two major branches of this approach, that is trench capacitors and stacked capacitors. In the category of trench capacitors, when the DRAM is beyond 16 Mbit, the trench needs to be very deep. There are technology and even theoretical physical limitations to processing the deep trenches that would be needed. When the stacked capacitor approach is used to fabricate 16 Mbit DRAMs and beyond, very complicated stacked structures are needed, such as fin structures, crown structures, and so forth. The making of such structures require complicated manufacturing processes which are costly and result in reduced yield.

Most recently a new concept has been advanced which calls for roughening the polycrystalline silicon surface of the capacitor electrode to increase the surface area. Several techniques for achieving a roughened surface of a polycrystalline silicon electrode layer have been suggested in technical paper recently presented by M. Sakao et al entitled "A CAPACITOR-OVER-BIT-LINE (COB) CELL WITH A HEMISPHERICAL-GRAIN STORAGE NODE FOR 64 Mb DRAMs" in IEDM 1990 TECHNICAL DIGEST pages 655-658; M. Yoshimaru et al entitled "RUGGED SURFACE POLY-SI ELECTRODE AND LOW TEMPERATURE DEPOSITED SILICON NITRIDE FOR 64 MBIT AND BEYOND STC DRAM CELL" in IEDM 1990 TECHNICAL DIGEST pages 659-662; and Pierre C. Fazan et al entitled "ELECTRICAL CHARACTERIZATION OF TEXTURED INTERPOLY CAPACITORS FOR ADVANCED STACKED DRAMs" in IEDM 1990 TECHNICAL DIGEST pages 663-666.

SUMMARY OF THE INVENTION

A principal object of the invention is to provide an effective and very manufacturable method to fabricate a capacitor device having an increased effective electrode surface area and the resulting capacitor structure.

Another object of this invention is to provide an new method for producing a roughened surface on a polycrystalline silicon surface for use in highly dense capacitor structures.

Yet another object of this invention is to provide a new more reliable method for producing high density DRAM devices and the resulting structure which features a new stacked capacitor structure.

In accordance with these objects of this invention, a new method to produce a microminiturized capacitor having a roughened surface electrode is achieved. The method involves depositing a first polycrystalline silicon layer over a suitable insulating base. A thin layer of refractory metal is deposited over the first polysilicon layer. The resultant composite layer is heated to cause silicidation and growth of silicon grain crystals on the surface which thereby produces a roughened surface. The metal silicide is now removed. An insulating layer is deposited over the roughened surface. The capacitor structure is completed by depositing a second thin polycrystalline silicon layer over the insulating layer.

BRIEF DESCRIPTION OF THE DRAWINGS

In the accompanying drawings forming a material par of this description, there is shown.

DESCRIPTION OF THE PREFERRED EMBODIMENTS

Figure 1:
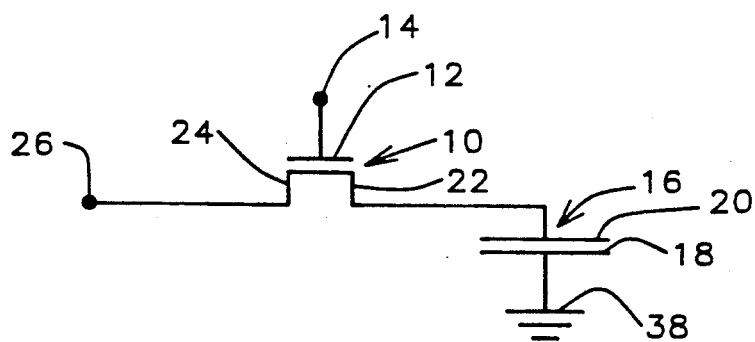
FIG. 1 is a schematic circuit diagram of a typical DRAM cell, which is known to the Prior Art.

Referring now more particularly to FIG. 1, there is shown an illustration of a single DRAM cell having a transistor 10, with gate electrode 12 electrically connected to a word line 14, and a capacitor 16 having a plate (ground plate) electrode 18 electrically connected to the ground, which could be for example the substrate, off chip, etc. and a electrode 20 (storage node) electrically connected to the drain region 22 of transistor 10.

Figure 2:
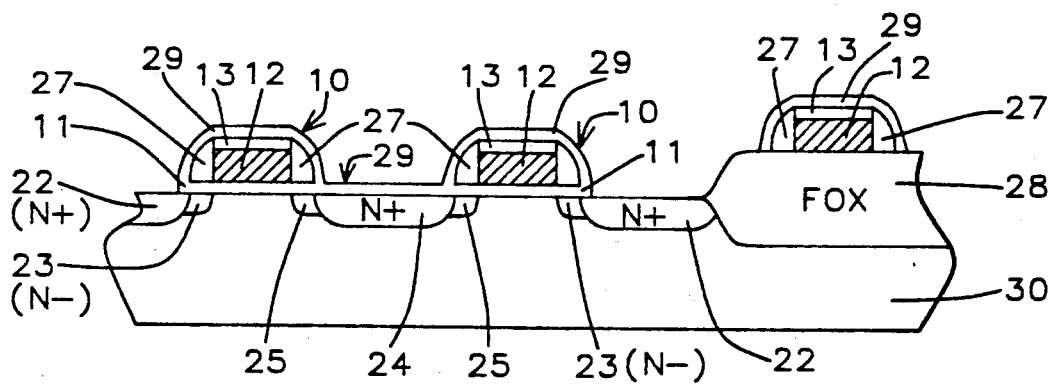
FIGS. 2, 3 and 5 schematically illustrate in cross-sectional representation one preferred embodiment of this invention.

Referring now to FIG. 2, there is illustrated a partially completed DRAM structure upon which the new capacitor structure of the invention will be fabricated. The first series of steps involve the formation of the dielectric isolation regions for isolating semiconductor surface regions from other such regions in the semiconductor substrate 30. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field OXide pattern, FOX 28. Then semiconductor devices can be provided in the silicon mesas according to the following processes.

The surface of the silicon substrate 30 is thermally oxidized to form the desired gate oxide 11 thickness. The preferred thickness is between about 80 to 200 Angstroms. The polysilicon layer 12 is blanket deposited by LPCVD (Low Pressure Chemical Vapor Deposition) method. The preferred thickness of the polysilicon layer 12 is between about 2000 to 4000 Angstroms. The polysilicon layer 12 is ion implanted with phosphorous or arsenic ions under the conditions 5 to 10 E 15 dosage per cm$^2$ and 20 to 60 Kev. or doped with phosphorus oxychloride at a temperature about 900° C. The surface of the layer is either thermally oxidized or a chemical vapor deposition process to form silicon oxide layer 13. The layers 11, 12 and 13 are patterned by conventional lithography and anisotropic etching techniques as are conventional in the art to provide a desired pattern of gate electrodes and structure on the FOX 28 surfaces or elsewhere as seen in FIG. 2.

The source/drain structure of the MOS FET may now be formed by the following steps. The FIG. 2 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 2, for example shows the ion implantations of N− dopants. Lithographic masks may be required to protect the areas not to be subjected to that particular N− ion implantation. The formation of the lithographic masks are done by conventional lithography and etching techniques. The N− lightly doped drain implantation 23 and 25 are done with, for example phosphorous P31 at a dose of between about 1 to 10 E 13 atoms/cm.$^2$ and with an energy of between about 20 to 40 Kev.

The dielectric spacer 27 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 27 is between about 2000 to 5000 Angstroms and preferably about 2500 Angstroms.

An anisotropic etching of this layer produces the dielectric spacer layer 27 on the sidewalls of the layer structures 11, 12, 13. The preferred anisotropic etching uses a conventional reactive ion etching ambient.

A thin silicon oxide, silicon nitride or the like masking layer 29 is formed upon the layer structure regions 11, 12, 13; the spacers 27 and the exposed monocrystalline silicon substrate regions. The conditions for forming this layer 29 are LPCVD deposition of TEOS or LPCVD silicon nitride deposition at about 600° to 900° C. or a composite layer of silicon oxide and nitride. The preferred thickness of this dielectric layer is between about 200 to 1000 Angstroms and a preferred thickness of about 600 Angstroms.

The N+ source/drain ion implantation uses Arsenic, As75 with a dose of between about 2 E 15 to 1 E 16 atoms/cm.$^2$ and energy of between about 20 to 70 Kev. to complete the source/drain regions 22 of the N channel lightly doped drain MOS FET integrated circuit device as seen in the FIG. 2. The layer 29 is removed from the surface of the DRAM active drain areas as shown in FIG. 2 to form the capacitor node contact area.

Figure 3:
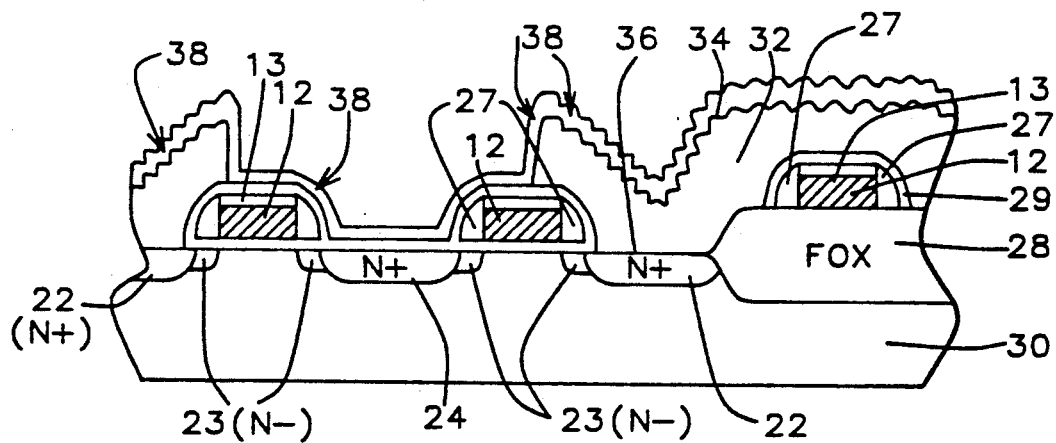

Referring now to FIG. 3, the capacitor structure is fabricated by depositing a first polycrystalline silicon layer 32 over the surface of the substrate 30 using the same deposition techniques described in regard to polycrystalline silicon layer 12. The thickness of the first layer is typically between about 3000 to 6000 Angstroms. An impurity is introduced into the first layer, either by ion implantation techniques or in situ doping. The impurity concentration in this first layer 32 is preferably between about $10^{18}$ to $10^{21}$ per cm.$^3$. A thin layer (not shown) of a refractory metal is now deposited over the surface of the first polycrystalline layer. The thin layer preferably has a thickness in the range of about 400 to 2000 Angstroms and is deposited by a suitable and conventional sputtering or evaporation method. The metals suitable for the thin refractory metal layer are titanium, cobalt, tungsten, platinum, etc. We will describe titanium as our preferred metal as our example hereinafter.

Figure 4:
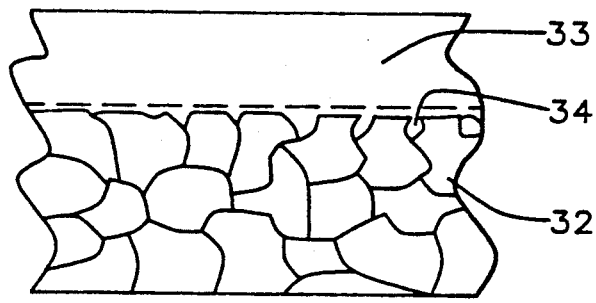
FIG. 4 schematically shows how the roughened surface is formed.

The composite polycrystalline and metal layer are heated to cause a metal silicide 33 to form in the surface of the first polycrystalline layer and cause the formation of silicon grain crystals on the surface. Because the metal film will react preferentially with the grain boundaries of the polycrystalline silicon under certain conditions, the uneven reaction rates of silicon grains and grain boundaries cause the roughened surfaces. FIG. 4 schematically shows this reaction effect wherein indentations at grain boundaries which reach the surface are the cause of the roughened surface. This effect is very unfavored in the common applications of the metal silicidations, but is favored in this particular application. The roughened surface is indicated by numeral 34.

An important feature of the process is that an excellent electrical contact is formed at the interface 36 between the source/drain 22 and the layer 32. The interface is indicated in FIG. 1 between electrode 20 and drain 22. Layer 32 is the eletrode 20 is FIG. 1. The contact resistance of the interface 36 between the polycrystalline silicon layer 32 and the drain of the access transistor 10 should be very low, and the resistance should be consistent batch to batch, between wafers in a single batch, and uniform across a single wafer in a batch. Maintaining an absolute highly clean interface during is difficult, because contamination of the substrate surface is difficult to avoid. Impurities present during processing, and the formation of native silicon oxide are the chief sources of contamination. However, in this process during the heating step, impurities at the interface are sucked toward the metal silicide layer. This gettering effect of the silicidation not only largely improves the consistency and uniformity, but also reduces the contact resistance and therefore speeds up the DRAM chip operation. The polycrystalline silicon grains will grow large, and the silicidation will take place preferentially along the polcrystalline silicon grain boundaries. The annealing temperature and time of annealing will vary depending upon the relationship. However, typically the annealing temperature will be in the range of about 500° to 1000° C., and the annealing time will be in the range of about 10 to 180 minutes in a conventional furnace with either argon or nitrogen ambient. Rapid thermal annealing can also be used, in this case 30 seconds to several minutes can be used. The temperature and time, of course will vary with the choice of metal. For titanium, 600° to 800° C. can be used. In the rapid thermal annealing case, about 60 to 120 seconds are operative in a nitrogen ambient.

Now the metal silicide 33 is removed, preferably with a clean etching solution, for titanium silicide such as hydrofluoric acid or buffered hydrofluoric acid. The metal silicide 33 can be easily striped from the roughened surface as seen in FIG. 4. Following the removal of the metal silicide, the roughed polysilicon layer is patterned, using conventional lithography and etching techniques.

Then a thin dielectric layer 38 is deposited. This layer serves as the capacitor dielectric. The thin dielectric or insulating layer has a thickness that is preferably in the range of about 30 to 250 Angstroms. The material of the dielectric layer can be of any suitable material having a high dielectric constant, and which forms a continuous, pinhole free layer. Preferably the dielectric layer is a composite layer of a silicon oxide-silicon nitride-silicon oxide with a total thickness of between about 40 to 150 Angstroms. Alternatively, and of particular importance for the future is the dielectric tantalum oxide, such as tantalum pentoxide or in combination with silicon dioxide and/or silicon nitride.

The preferred thickness of tantalum oxide or tantalum pentoxide is between about 150 Angstroms to 1000 Angstroms. The materials are of particular importance, because of their high dielectric constant and the well understood relationship between capacitance, C, dielectric constant, E, and thickness of dielectric, d, which is $C = E/d$. The dielectric constant of silicon dioxide is 3.9, silicon nitride is 8.0 and tantalum pentoxide is 22.0. Therefore, the effective thickness of tantalum pentoxide is about 5 times thinner than silicon dioxide.

Tantalum oxide may be deposited by several well known methods including chemical vapor deposition as taught by, for example, M. Saitoh et al ELECTRICAL PROPERTIES OF THIN $TA_2O_5$ FILMS GROWN BY CHEMICAL VAPOR DEPOSITION published at IEDM'86 pages 680-683; Y Numasawa et al $TA_2O_5$ PLASMA TECHNOLOGY FOR DRAM STACKED CAPACITORS published at IDEM '89 pages 43-46; and by reactive sputtering deposition as shown by H. Shinriki et al OXIDIZED $TA_2O_5/SI_3N_4$ DIELECTRIC FILMS FOR ULTIMATE STC DRAMS published in IEDM '86 pages 684-687.

Figure 5:
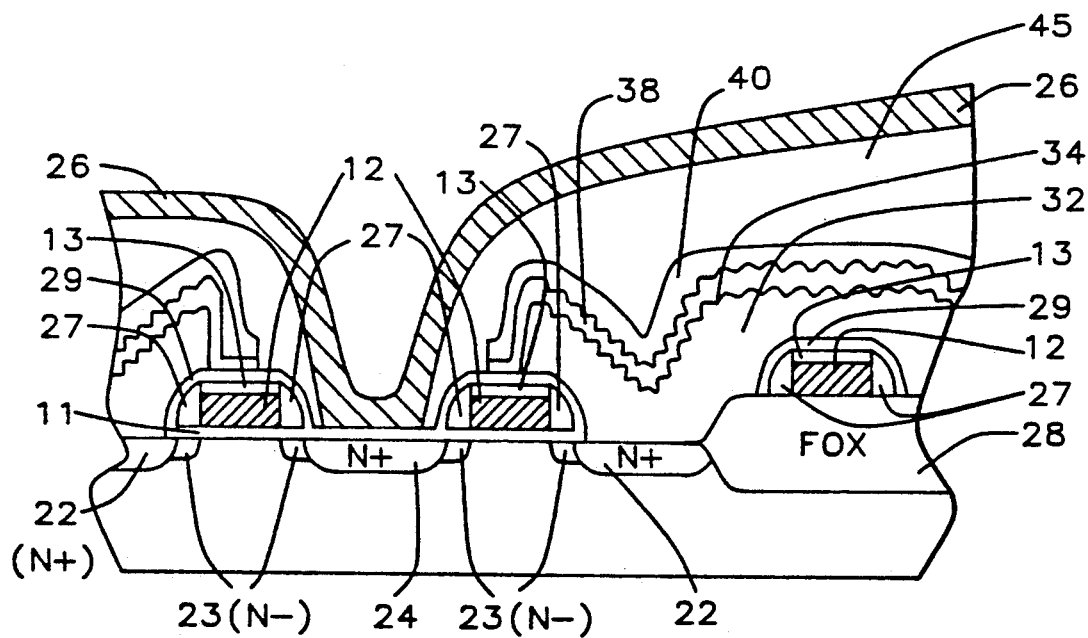

As shown in FIG. 5, a second polycrystalline silicon layer 40 is deposited over layer 30 and patterned to serve as the second electrode 18 in FIG. 1. The second polycrystalline silicon layer is also doped with an impurity, preferably with a concentration in the range of about $10^{18}$ to $10^{21}$ cm$^3$.

FIG. 5 shows the completion of the metal contacts to the monocrystalline silicon regions such as the bit line 26 contact to source regions 24. An insulating structure 45 may be composed of, for example, a layer of silicon dioxide and a much thicker layer of borophosphosilicate glass, phosphosilicate glass or similar insulating layer. The operational thicknesses of these layers are between about 1000 to 2000 Angstroms for the oxide layer and between about 2000 to 10,000 or more Angstroms for the glasseous layer. These layers are typically deposited by chemical vapor deposition in low pressure or atmospheric pressure, or in a plasma enhanced reactive chamber.

The contact windows or openings are now formed through the insulating layered structure to the source regions 24 or the like in the device regions. The opening are not shown to the other regions, because they are outside of the cross-section of FIG. 5. This process step is conventionally done by lithography and etching techniques which preferably use a reactive ion etching process that will anisotropically etch both components of the insulating layer structure 45. A typical reactive ion etching process using fluorine containing etching chemical species. These oxide/glass layers etching processes are well known to those in the art. The size of the contact window opening can be as small as limitation of the etching and lithography patterning capability.

A bit line metal or composite metal layer or polycide composite layer (such as tungsten polycide) 26 is deposited over the exposed device region 24 and the insulating layer structure 45 both above and on the sides of the opening. This layer may be deposited by, for example chemical vapor depostion or sputtering. The operational thickness is between about 2000 to 10,000 Angstroms and the preferred thickness is between about 5000 to 7000 Angstroms. The thickness of this layer 26 is dependant upon the height and profile of the contact hole. This metal layer may be aluminum, aluminum-silicon, aluminum-silicon-copper, polycide, conductively doped polysilicon, tungsten or the like. Alternatively, a barrier metal layer (not shown) can be used under this metal layer.

The effective capacitor area, due to the roughened surface of the electrode, increases the electrical capacitance, per unit planar area, of the capacitor by approximately 50%. This will make it possible ot fabricate DRAMs of 16 Mbit and 64 Mbit or beyond with a simple stacked capacitor as described by the invention herein where ONO dielectric is used. To otherwise produce a capacitor for 16 to 64 Mbit DRAMs would require a 3-D complicated capacitor structure using ONO. When using the present invention, 256 Mbit to 1 Gbit DRAMs are possible using tantalum oxide dielectric materials.

The process of the invention also results in an excellent cell contact. Further, the process is simple and effective.

While the invention has been particularly shown and described with reference to the preferred embodiments thereof, it will be understood by those skilled in the art that various changes in form and details may be made without departing from the spirit and scope of the invention.

What is claimed is:

1. A method to produce a roughened surface capacitor fabricated on a monocrystalline semiconductor substrate comprising:

depositing a thin first polycrystalline silicon layer to form a first capacitor plate on a particularly completed DRAM over a base insulating layer and a contact opening exposing said substrate;

doping said first polycrystalline silicon layer with an impurity for semiconductors;

depositing a thin layer of a metal capable of forming a silicide over the surface of said first layer;

heating the resultant composite layer at a temperature to cause silicidation for a time sufficient to preferentially react with grains versus grain boundaries and to grow silicon grain crystals on the surfaces to thereby producing a roughened surface;

removing the metal silicide from the resultant roughened composite layer with a suitable etchant;

depositing a thin insulating layer to form a capacitor dielectric layer over the surface of the roughened layer; and depositing a second thin polycrystalline silicon layer over said thin insulating layer to form the second capacitor plate.

2. The method of claim 1 wherein said first polycrystalline silicon layer is doped with an impurity in a concentration of between about $10^{18}$ to $10^{21}$ cm$^3$.

3. The method of claim 1 wherein said impurity is introduced into said first layer by combining it with the reactant for depositing the said first layer as the layer is deposited.

4. The method of claim 1 wherein said impurity is introduced into said first layer by ion implantation.

5. The method of claim 1 wherein said metal is a refractory metal and is titanium.

6. The method of claim 5 wherein the thickness of said layer of titanium is between about 400 to 2000 Angstroms.

7. The method of claim 5 wherein the composite layer of titanium and polycrystalline silicon is heated to a temperature between about 500° to 1000° C.

8. The method of claim 7 wherein said composite layer is heated for a time in the range of 10 to 180 minutes in an inert atmosphere.

9. The method of claim 5 wherein the resultant layer of titanium disilicide is removed by a buffered hydrofluoric acid solution.

10. The method of claim 1 wherein said metal is cobalt.

11. The method of claim 1 wherein said metal is tungsten.

12. The method of claim 1 wherein the thickness of said thin insulating layer is between about 30 to 250 Angstroms.

13. The method of claim 12 wherein the thin insulating layer is a composite layer of silicon oxide, silicon nitride and silicon oxide.

14. The method of claim 12 wherein the thin insulating layer at least includes tantalum oxide.

15. The method of claim 12 wherein the thickness of said second polycrystalline silicon layer is between about 500 to 3000 Angstroms.

16. The method of claim 1 wherein said roughened surface capacitor is made in combination with a field effect transistor and is adapted for use in a high density dynamic random access memory.

17. The method of claim 1 wherein following said removal of said metal silicide layer, the said first polycrystalline silicon layer is patterned as an electrode of said capacitor.

* * * * *